United States Patent
Hashimoto et al.

(10) Patent No.: US 6,664,731 B2
(45) Date of Patent: Dec. 16, 2003

(54) CHARGE INJECTION TYPE LIGHT EMITTING DEVICE

(75) Inventors: Yuichi Hashimoto, Tokyo (JP); Tatsundo Kawai, Kanagawa (JP); Kazunori Ueno, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/096,311

(22) Filed: Mar. 13, 2002

(65) Prior Publication Data

US 2002/0171358 A1 Nov. 21, 2002

(30) Foreign Application Priority Data

Mar. 15, 2001 (JP) .......................... 2001-073454
Mar. 6, 2002 (JP) .......................... 2002-059780

(51) Int. Cl.[7] .................................................. H01J 1/62
(52) U.S. Cl. .......................... 313/504; 313/506
(58) Field of Search .................... 313/504, 498, 313/506

(56) References Cited

U.S. PATENT DOCUMENTS

| | | | |
|---|---|---|---|
| 3,172,862 A | 3/1965 | Gurnee et al. | 252/301.3 |
| 3,173,050 A | 3/1965 | Gurnee | 313/108 |
| 3,710,167 A | 1/1973 | Dresner et al. | 313/108 A |
| 4,356,429 A | 10/1982 | Tang | 313/503 |
| 4,539,507 A | 9/1985 | VanSlyke et al. | 313/504 |
| 4,720,432 A | 1/1988 | VanSlyke et al. | 428/457 |
| 4,769,292 A | 9/1988 | Tang et al. | 428/690 |
| 5,444,833 A | 8/1995 | Kawai et al. | 395/133 |
| 5,666,555 A | 9/1997 | Okazaki et al. | 395/807 |

FOREIGN PATENT DOCUMENTS

| | | |
|---|---|---|
| JP | 59-194393 | 11/1984 |
| JP | 63-264692 | 11/1988 |
| JP | 3-163188 | 7/1991 |

OTHER PUBLICATIONS

Pope, et al., "Electroluminescence in Organic Crystals," J. Chem. Phys., vol. 38, pp. 2042–2043, 1963.

Helfrich, et al., "Recombination Radiation in Anthracene Crystals," Physical Review Letters, vol. 14, No. 7, pp. 229–231, Feb. 14, 1965.

Helfrich, et al., "Transients of Volume–Controlled Current and of Recombination Radiation in Anthracene," The Journal of Chemical Physics, vol. 44, No. 8, pp. 2902–2909, Apr. 15, 1966.

Schadt, et al., "Low–Temperature Hole Injection and Hole Trap Distribution in Anthracene," The Journal of Chemical Physics, vol. 50, No. 10, pp. 4364–4368, May. 15, 1969.

Schwob, et al., "Charge Transfer Exciton Fission in Anthracene Crystals," The Journal of Chemical Physics, vol. 58, No. 4, pp. 1542–1547, Feb. 15, 1973.

Hoytink, et al., "Magnetic Field Effects on Recombination Radiation in Tetracene Crystal," Chemical Physical Letters, vol. 36, No. 3, pp. 345–348, Nov. 15, 1975.

(List continued on next page.)

Primary Examiner—Vip Patel
(74) Attorney, Agent, or Firm—Fitzpatrick, Cella, Harper & Scinto

(57) ABSTRACT

The present invention provides a very durable charge injection type light emitting device. In a charge injection type light emitting device comprising a positive electrode, a negative electrode, and an organic film sandwiched between the positive and negative electrodes and composed of one or more organic compounds, the organic film containing at least one light emitting layer, a potential barrier to electrons between the light emitting layer and a barrier layer defined as a member that contacts with the light emitting layer from the positive electrode side is 0.5 eV or more.

4 Claims, 3 Drawing Sheets

OTHER PUBLICATIONS

Vincett, et al., "Electrical Conduction and Low Voltage Blue Electroluminescence In Vacuum–Deposited Organic Films," International Journal on the Science and Technology of Thin and Thick Films, Thin Solid Films, Electronics and Optics, vol. 94, No. 2, pp. 171–183, Aug. 13, 1982.

Patridge, "Electroluminescence from Polyvinylcarbazole Films: 3. Electroluminescent Devices," Polymer, vol. 24, pp. 748–754, Jun. 1983.

Hayashi, et al., "Electroluminescence of Perylene Films with a Conducting Polymer as an Anode," Japanese Journal of Applied Physics, vol. 25, No. 9, pp. L773–L775, Sep. 9, 1986.

Tang, et al., "Organic Elctroluminescent Diodes," Applied Physics Letters, vol. 51, No. 12, pp. 913–915, Sep. 21, 1987.

Moon, et al., "High–Density Bi–Pb–Sr–Ca–Cu–O Superconductor Prepared by Rapid Thermal Melt Processing" Applied Physics Letters, vol. 55, No. 14, pp. 1466–1468, Oct. 2, 1989.

Adachi, et al., "Organic Electroluminescent Device with a Three–Layer Structure," Japanese Journal of Applied Physics, vol. 27, No. 4, pp. L713–L715, Apr. 4, 1988.

Adachi, et al., "Electroluminescence in Organic Films with Three–Layer Structure," Japanese Journal of Applied Physics, vol. 27, No. 2, pp. L269–L271, Feb. 2, 1988.

Fujii, et al., Collection 1041 of Manuscripts for the Lecture of the Fifty–first Applied Physics Society for the lecture entitled "Organic EL Device Using Cast Polymer Film as Hole Transport Layer." (1990) (with translation) (28a–PB–7).

Mori, et al., Collection 1006 of Manuscripts for the Lecture of the Fiftieth Applied Physics Society for the lecture entitled "Preparation of Organic EL Device by Casting Method, and Evaluation of Device." (1989) (with translation) (29p–ZP–5).

Y. Mori, et al., Collection of 1086 Manuscripts for the Lecture of the Thirty–eighth Applied Physics Related Alliance for the lecture entitled "Luminescence Characteristics of Mixed Monolayer Type of Organic EL Device." (1991) (with translation) (31p–G–12).

CHARGE INJECTION TYPE LIGHT EMITTING DEVICE

BACKGROUND OF THE INVENTION

1. Field of the Invention

The present invention relates to a charge injection type light emitting device which has a light emitting layer composed of a luminous substance and which can convert field applied energy directly into optical energy when an electric field is applied thereto.

More specifically, compared to conventional incandescent lamps, fluorescent lamps, or light emitting diodes the present invention relates to a charge injection type light emitting device characterized by a large size in area, a high resolution, a small thickness and weight, high-speed operations, and a perfectly solid body and which is used for an electroluminescence (EL) panel that can meet advanced requirements.

2. Related Background Art

An electroluminescence phenomenon of organic material was observed in an anthracene monocrystal by Pope et al. in 1963 (J. Chem. Phys. 38 (1963) 2042), and subsequently in 1965, Helfinch and Schneider successfully observed relatively intense ejection-type electroluminescence (EL) using a solution electrode system having high ejection efficiency (Phys. Rev. Lett. 14 (1965) 229).

Subsequently, as reported in U.S. Pat. Nos. 3,172,862, 3,173,050, 3,710,167, J. Chem. Phys. 44 (1966) 2902, J. Chem. Phys. 50 (1969) 14364, J. Chem. Phys. 58 (1973) 1542, or J. Chem. Phys. Lett. 36 (1975) 345, etc. research was conducted to form organic luminous substance using a conjugate organic host material and a conjugate organic activator having a condensed benzene ring. Cited examples of organic host substances include naphthalene, anthracene, phenanthrene, tetracene, pyrene, benzopyrene, chrysene, pycene, carbazole, fluorene, biphenyl, taphenyl, triphenylene oxide, dihalobiphenyl, trans-stilpene, and 1,4-diphenyl butadiene, and cited activators include anthracene, tetracene, and bentacene.

However, all organic films composed of these organic luminous substances exist as single layers having a thickness exceeding 1 $\mu$m, requiring significant electric fields for light emission. Thus, thin film elements formed by a vacuum deposition process were studied (for example, Thin Solid Films 94 (1982) 171, Polymer 24 (1983) 748, Jpn. J. Appl. Phys. 25 (1986) L773).

However, the formation of thin films was effective in reducing drive voltage but failed to provide high-luminance devices that could be appropriately put to practical use.

However, in recent years, Tang et al. (Appl. Phys. Lett. 51 (1987) 913 or U.S. Pat. No. 4,356,429) invented an EL device in which two very thin layers (a charge transporting layer and a light emitting layer) are stacked together between a positive electrode and a negative electrode by vacuum deposition, thereby achieving high luminance at a low drive voltage.

Such stacked organic EL devices have subsequently been actively studied, as described in, for example, Japanese Patent Application Laid-Open No. 59-194393, U.S. Pat. No. 4,539,507, Japanese Patent Application Laid-Open No. 59-194393, U.S. Pat. No. 4,720,432, Japanese Patent Application Laid-Open No. 63-264692, Appl. Phys. Lett. 55 (1989) 1467, and Japanese Patent Application Laid-Open No. 3-163188.

Furthermore, Jpn. J. Appl. Phys. 27 (1988) L269, L713 has reported on an EL device of a three layer structure in which a carrier transporting function and a light emitting function are separated from each other. It also suggests that this device serves to relax constraints on carrier transportation performance in connection with selection of a pigment for the light emitting layer, which determines an emission color, thereby enabling much more free selection. It further suggests that this device serves to improve light emission by effectively containing holes and electrons (or excitons) in a central light emission layer.

Although a vacuum deposition process has commonly been used to produce stacked organic EL devices, it has been reported that considerably bright devices are also obtained by a casting process (for example, Collection 1006 of Manuscripts for the Lecture of the Fiftieth Applied Physics Society (1989) and Collection 1041 of Manuscripts for the Lecture of the Fifty-first Applied Physics Society (1990)).

Furthermore, it has been reported that a substantially high emission efficiency is achieved by a mixed single-layer type EL device formed by a dip coating process using a solution comprised of a mixture of polyvinyl carbazole as a compound having hole transporting capability, an oxadiazole derivative as a compound having electron transporting capability, and cumarin 6 as a luminous element (for example, Collection 1086 of Manuscripts for the Lecture of the Thirty-eighth Applied Physics Related Alliance (1991)).

As described above, organic EL devices have recently been markedly improved, and the possibility of their use for various applications has been suggested.

However, this device has not been studied long, and materials and device forming processes have not been sufficiently studied yet. At present, there still remain unsolved durability problems such as changes over time in characteristics during longtime use and degradation caused by atmospheric gas containing oxygen or humidity. For example, the following problems must be solved:

Organic light emitting devices are of a charge injection type, and their characteristics depend strongly on the amount of carriers injected from both electrodes. Desirably, carriers are always regularly injected from the electrodes (positive and negative) in spite of longtime use.

However, in actuality, partly because of the incomplete electrical matching between organic layers, those of the current carriers flowing through the device which do not particularly contribute to light emission flow from the light emitting layer into the positive electrode during longtime use. Consequently, degradation occurs in the interface between a barrier layer, which contacts with the light emitting layer from the positive electrode side, and the light emitting layer, and also occurs inside the barrier layer, thus reducing the light emission efficiency of the device during longtime use.

SUMMARY OF THE INVENTION

The present invention is provided to solve these problems, and it is an object thereof to provide a charge injection type light emitting device that is very durable, i.e., a charge injection type light emitting device that has a long luminance half-value period.

According to an aspect of the present invention, there is provided a charge injection type light emitting device comprising a positive electrode, a negative electrode and an organic film sandwiched between the positive and negative electrodes and comprised of an organic compound, the organic film containing light emitting material that emits light by itself, wherein the energy difference between a vacuum level and the lower end of a conduction band of the light emitting material (Ec, to be referred to as a conduction band level of the light emitting material hereinafter) and the energy difference between a vacuum level and the lower end of a conduction band of a barrier material (Hc, to be referred to as a conduction band level of the barrier material hereinafter) different from the light emitting material meet the condition of Ec–Hc>0.5 eV.

The conduction band levels Ec and Hc may meet the condition Ec–Hc≧0.6 eV.

The light emitting material may contain a hydrocarbon compound having a condensed ring (hereinafter referred to as a "condensed hydrocarbon compound").

The barrier material may be arranged as a hole transporting layer comprised of an organic compound having hole transporting capability.

DESCRIPTION OF THE PREFERRED EMBODIMENTS

Figure 1:
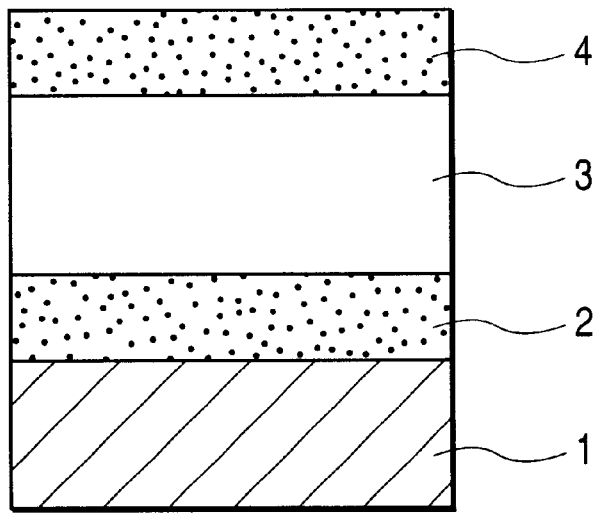
FIG. 1 is a sectional view showing an example of a charge injection type light emitting device.
Figure 4:
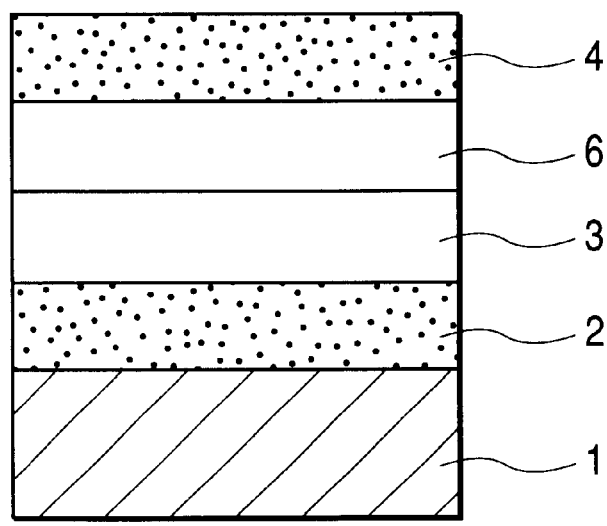
FIG. 4 is a sectional view showing still another example of a charge injection type light emitting device.

In a charge injection type light emitting device according to the present invention comprising a positive electrode, a negative electrode and an organic film sandwiched between the positive and negative electrodes and comprised of an organic compound, the organic film including a light emitting material that emits light by itself, the conduction band level Ec of the light emitting material and the conduction band level Hc of a barrier material different from the light emitting material meet the condition Ec–Hc>0.5 eV. The barrier material may be contained in the layer in which the light emitting material is contained as shown in FIGS. 1 and 4 or may be provided between the light emitting material and the positive electrode as a barrier layer. A difference between conduction band levels of the materials may be referred to as a "potential barrier" or a "barrier difference to electron ejection". Further, the term "barrier layer" refers to a material that substantially contacts with the light emitting layer on the positive electrode side. An example of the barrier layer is a hole transporting layer.

Furthermore, when the above conditional expression is met, the light emitting material containing at least one type of condensed hydrocarbon compound is more effective than a metal complex-based light emitting material. More concretely, it is assumed that a blue light emitting device is to be provided. The condensed hydrocarbon compound has a high electron mobility and a high quantization efficiency. As a result, if the condensed hydrocarbon compound is applied to a device meeting the above conditional expression in the present invention, then the barrier material preferably blocks electrons to increase the probability of the rebinding between holes and electrons.

The charge injection type light emitting device constructed as described above can efficiently block injection of electrons from the light emitting material into the barrier material in contact with the light emitting material, thereby suppressing degradation of the interface between the light emitting material and the barrier material during longtime use.

Embodiments of the present invention will be described below with reference to the drawings illustrating the layer configurations of light emitting devices.

The term "light emitting layer" in the present invention is implied in the "organic film" in the present invention and means the entire layer having the light emitting capability and being used as a luminous element, but is not limited to the meaning of the single layer.

(First Embodiment)

FIG. 1 is a sectional view showing an embodiment of a charge injection type light emitting device according to the present invention. The device of the embodiment is constructed by sequentially disposing positive electrode 2, organic film 3 and negative electrode 4 on substrate 1.

In the embodiment, the organic film is comprised of the light emitting material that emits light by itself and the barrier material. Accordingly, in the embodiment, the whole of the organic film corresponds to a light emitting layer, and the barrier material is mixed in the light emitting layer.

The embodiment is useful for a case in which the light emitting layer is comprised of a compound having an electron transporting ability, a hole transporting ability and a light emitting ability and a compound having a hole transporting ability, which latter compound corresponds to the barrier material.

(Second Embodiment)

Figure 2:
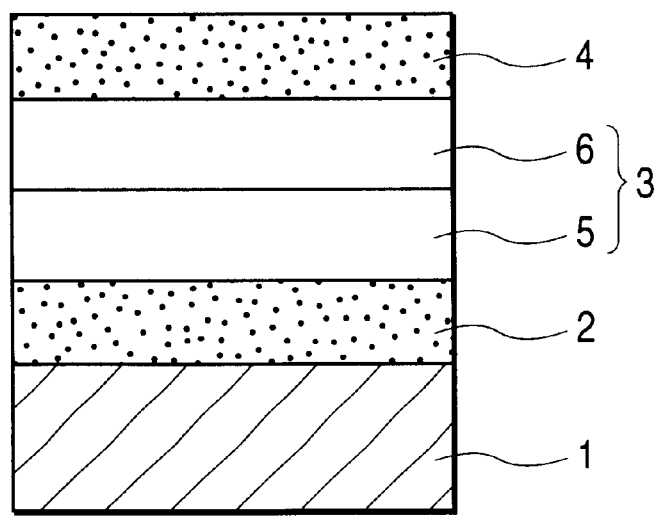
FIG. 2 is a sectional view showing another example of a charge injection type light emitting device.

FIG. 2 is a sectional view showing another embodiment of a charge injection type light emitting device according to the present invention. A device of the embodiment is constructed by sequentially disposing positive electrode 2, hole transporting layer 5, electron transporting layer 6 and negative electrode 4 on substrate 1. In the embodiment, the electron transporting layer 6 is comprised of a material having an electron transporting ability, and the hole transporting layer 5 is comprised of a compound having a hole transporting ability, which latter compound corresponds to the barrier material. The hole transporting layer therefore corresponds to the barrier material comprehensively.

The embodiment can be classified into three groups: Group A wherein only the electron transporting layer has a light emitting material that emits light by itself; Group B wherein only the hole transporting layer has the light emitting material; and Group C wherein both the electron transporting layer and the hole transporting layer have the light emitting material. In the case of Group A, the electron transporting layer corresponds to the organic film which consists of only the light emitting layer so that the hole transporting layer can be the barrier layer. In the case of Group B, the organic film is composed of the electron transporting layer and the hole transporting layer, and the hole transporting layer is the light emitting layer as well as the barrier material. In the case of Group C, the light emitting layer 3 is composed of the electron transporting layer and the hole transporting layer.

(Third Embodiment)

Figure 3:
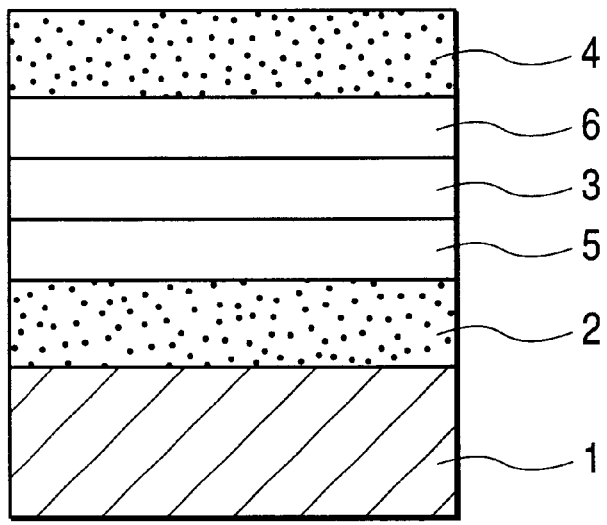
FIG. 3 is a sectional view showing yet another example of a charge injection type light emitting device.

FIG. 3 is a sectional view showing a further embodiment of a charge injection type light emitting device according to the present invention. The device of the embodiment is constructed by sequentially disposing positive electrode 2, hole transporting layer 5, light emitting layer 3, electron transporting layer 6 and negative electrode 4 on substrate 1.

In the embodiment, the organic film corresponds to a combination of the electron transporting layer and the light emitting layer, and the hole transporting layer corresponds to not only the barrier material but also the barrier layer.

(Fourth Embodiment)

FIG. 4 is a sectional view showing a further embodiment of a charge injection type light emitting device according to the present invention. The device of the embodiment is constructed by sequentially disposing positive electrode 2, light emitting layer 3, electron transporting layer 6 and negative electrode 4 on substrate 1.

In the embodiment, the organic film corresponds to a combination of the electron transporting layer and the light emitting layer, and the barrier material corresponds to the compound having a hole transporting ability mixed in the light emitting layer.

In the charge injection type light emitting devices of the 3rd and 4th embodiments, the carrier transporting function and the light emitting function are separated from each other. These light emitting devices are combined, as appropriate, with a compound having the hole transporting capability, electron transporting capability, or light emitting capability, thereby allowing the materials to be much more freely selected. This also enables the use of various compounds with different emission wavelengths, thus diversifying emission hues. Furthermore, holes and electrons (or excitons) can be effectively contained in the central light emitting layer to improve emission efficiency.

Thus, compared to the charge injection type light emitting device described in the Background Art, the charge injection type light emitting device constructed according to any of the embodiments of the present invention can efficiently block injection of electrons from the light emitting layer into the barrier layer, which is in contact with the light emitting layer. Accordingly, the light emitting device of the present invention can maintain a good balance between a hole injection property and an electron injection property, both properties relating to light emission, and can be used in any of the embodiments in FIGS. 1 to 4 as required, which are cited as examples.

As components of the light emitting layer, the organic light emitting device of the present invention may use, as required, two or more types of compounds such as hole transporting compounds, which have been researched in the fields of electrophotographic photosensitive members and the like, known hole-transporting luminous-element compounds or electron transporting compounds, or known electron-transporting luminous-element compounds. However, the organic light emitting device of the present invention more desirably contains at least one type of condensed hydrocarbon compound.

In the organic light emitting device of the present invention, the light emitting layer is commonly formed into a thin film by vacuum deposition or is combined with an appropriate binding resin to form a thin film.

This binding resin can be selected from a wide range of such resins including but not limited to, for example, a polyvinyl carbazole resin, polycarbonate resin, polyester resin, polyallylate resin, butyral resin, polystyrene resin, polyvinyl acetal resin, diallyl phthalate resin, acrylic resin, methacrylic resin, phenol resin, epoxy resin, silicon resin, polysulfone resin, and urine resin. One or more types of these resins may be mixed together to form a copolymer.

On the other hand, the material for the negative electrode includes lithium, calcium, magnesium, silver, lead, tin, magnesium, aluminum, manganese, indium, chromium, or an alloy thereof, all of which are small in work function.

Compared to conventional incandescent lamps, fluorescent lamps, or light emitting diodes, the organic light emitting device of the present invention is a perfectly solid device that is large in area, has a high resolution, is thin and light, and operates at high speed. The organic light emitting device of the present invention can be used for an EL panel that can meet advanced requirements.

EXAMPLES

The present invention will be specifically described below with reference to examples.

Examples 1 to 4 and Comparative Example 1

In a charge injection type light emitting device, to mainly observe how electrons are injected into a hole transporting layer of a charge injection type light emitting device, which corresponds to a barrier layer, semitransparent aluminum was used as a positive electrode.

Samples were produced by providing semitransparent Al on a glass substrate as a positive electrode and then forming, in a vacuum, a film composed of a compound expressed by one of the following structural formulae (a) to (e) and serving as a hole transporting layer, and then a gallium phthalocyanine film serving as an optical-electron injecting layer (electron injecting layer) in place of an electron transporting layer composed of $Alq_3$, and an Al film serving as a negative electrode. In this example, the light emitting layer of the present invention corresponds to the optical-electron injecting layer.

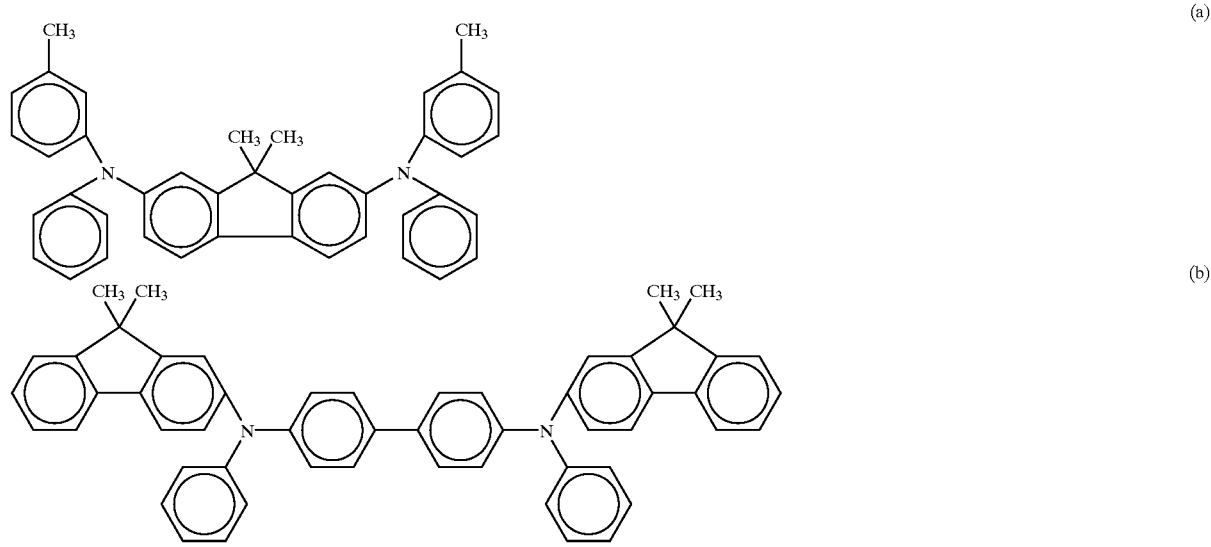

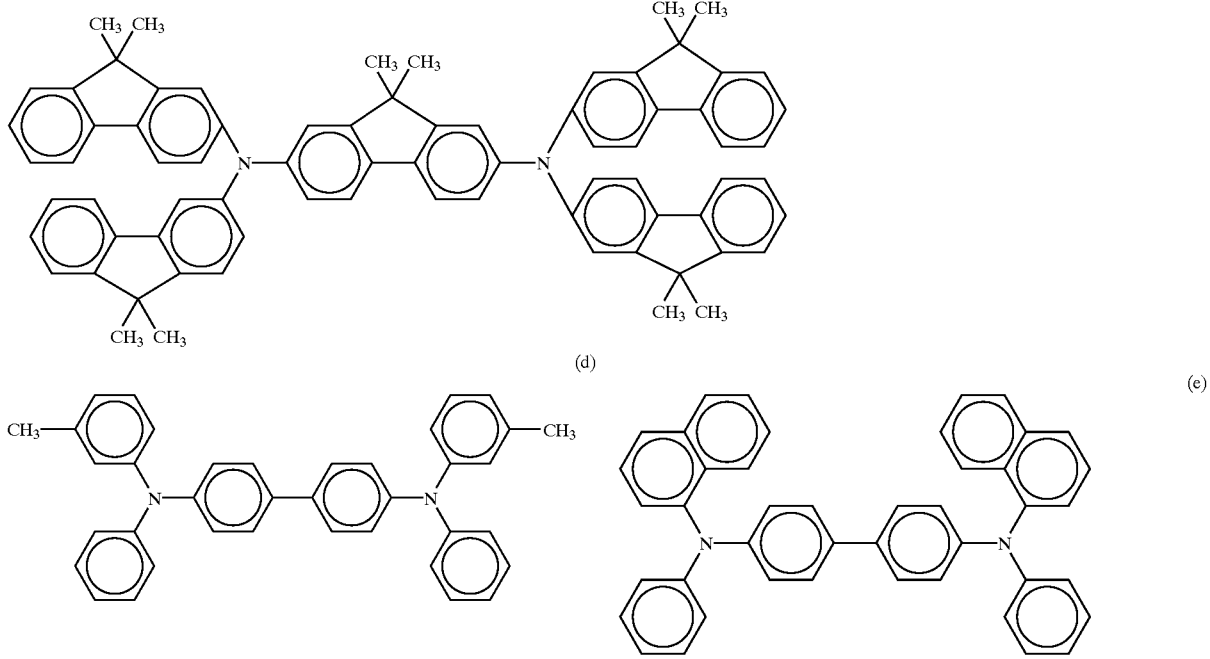

Figure 5:
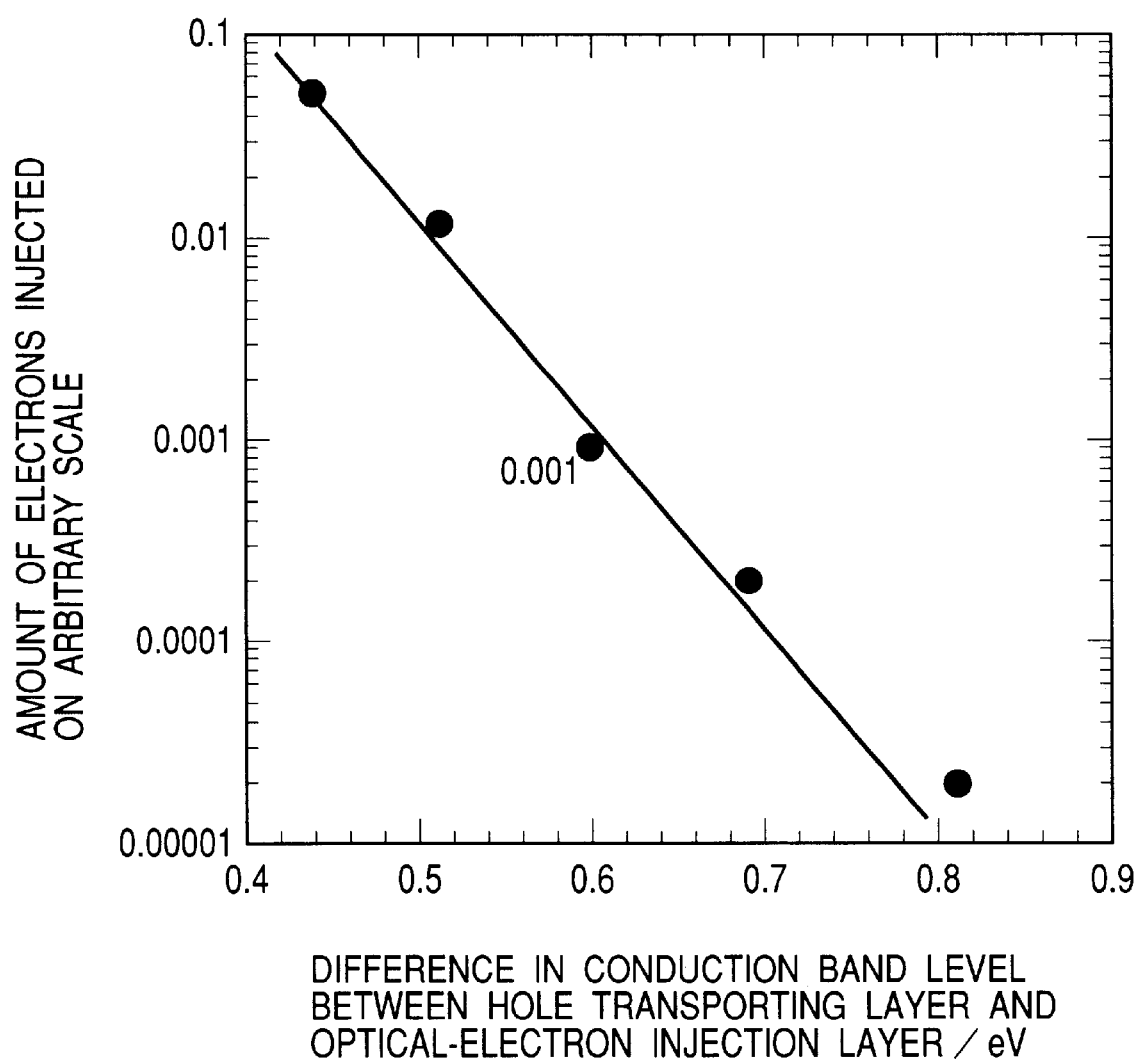
FIG. 5 is a chart showing a variation in the amount of electrons injected vs. a difference in conduction band level between a hole transporting layer and an optical-electron injection layer both used in the charge injection type light emitting device.

The device was irradiated with red LED light from the positive electrode side, while applying voltage to between the electrodes of the sample, to determine the amount of electrons injected from the optical-electron injecting layer (gallium phthalocyanine layer) into the hole transporting layer. The results are shown in FIG. 5. In this figure, the samples produced using the compounds expressed by the formulae (a) to (d) correspond to Examples 1 to 4, and the sample produced using the compound expressed by the formula (e) corresponds to Comparative Example 1.

The axis of abscissas indicates a difference in conduction band level between the hole transporting layer and the optical-electron injecting layer, that is, a difference barrier to electron injection from the optical-electron injecting layer to the hole transporting layer. Further, the energy values of the conduction bands of the optical-electron injecting layer and hole transporting layer were obtained by subtracting a band gap value calculated for the optical adsorption end of each layer, from the ionization potential value of the layer determined using a surface analyzer (manufactured by Riken Instrument Co., Ltd.; AC-1).

Further, the amount of electrons, indicated on the axis of ordinates, was measured by applying a fixed electric field (0.4 MV/cm) to the samples to generate a uniform amount of carriers in the gallium phthalocyanine layer of each sample.

As is apparent from FIG. 5, the amount of electrons injected relates exponentially to the difference in conduction band level between the hole transporting layer and the optical-electron injecting layer. Thus, with only a small change in energy difference between these layers, the amount of electrons injected into the hole transporting layer changes significantly.

The illustrated compound (e), in which the energy difference between these layers is 0.5 eV, has an excessively short drive life when formed into a device as described later. The charge injection type light emitting device of the present invention, which meets Conditional Expression (I), i.e., the charge injection type light emitting device in which the energy difference between these layers is more than 0.5 eV, can efficiently block injection of electrons from the optical-electron injecting layer to the hole transporting layer, which is in contact with the optical-electron injecting layer. This minimizes degradation of the interface between the hole transporting layer and the optical-electron injecting layer during longtime use.

Further, more preferably, when the boundary value of Conditional Expression (I) is set at 0.6 eV or more, the amount of electrons injected is one-several-hundredths of that in the illustrated compound (e), thereby further perfectly blocking electrons. This minimizes a decrease in light emission from the device during longtime use.

When the potential barrier to electrons between the light emitting layer and the barrier layer is 0.5 eV or more or preferably 0.6 eV or more, injection of electrons into the barrier layer is inhibited, thereby minimizing a decrease in luminance even if an injection type light emitting device, which provides a high emission intensity, is used over a long time.

Examples 5 to 8 and Comparative Example 2

Devices using the compounds (a) to (d), corresponding to Examples 5 to 8, and a device using the compound (e), corresponding to Comparative Example 2, were produced by using an ion plating process to form a film of a transparent positive electrode of indium-tin oxide (ITO) on a glass plate so that the film had a thickness of 100 nm, and then using a vacuum deposition process to sequentially form, on the transparent positive electrode, a hole transporting layer (film thickness: 60 nm) composed of one of the compounds (a) to (e), illustrated above, an electron transporting layer (also used as a light emitting layer; film thickness: 60 nm) composed of the compound (f), described below, which is a condensed hydrocarbon compound, and a negative electrode (film thickness: 120 nm) composed of Al. In these examples, the light emitting layer of the present invention corresponds to the electron transporting layer, and the barrier layer corresponds to the hole transporting layer.

The energy value of the conduction band was determined using a method similar to that in Example 1 or other examples. The conduction band of the electron transporting layer, composed of the compound (f), had an energy value of 2.58 eV.

Compound (f)

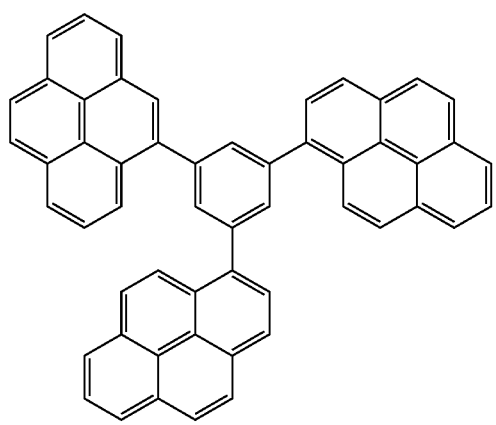

A current of current density 20 mA/cm$^2$ was allowed to flow through the devices produced in the above manner, and the time required for an initial luminance to decrease to a half value was observed. The results are shown in Table 1.

TABLE 1

| Sample | Difference in conduction band level between hole transporting layer and electron transporting layer [eV] | Luminance half-value period [hours] |
|---|---|---|
| Example 5 | 0.81 | 700 |
| Example 6 | 0.69 | 570 |
| Example 7 | 0.60 | 450 |
| Example 8 | 0.51 | 90 |
| Comparative Example 2 | 0.44 | 1 |

The results in Table 1 evidently show that the charge injection type light emitting device in which the present invention has been implemented has a significantly longer luminance half-value period than charge injection type light emitting devices in which the present invention has not been implemented.

Examples 9 to 12 and Comparative Example 3

Devices were formed as Examples 9 to 12 and Comparative Example 3 using a method similar to that for Examples 5 to 8 and Comparative Example 2 except that the electron transporting layer (also used as a light emitting layer; film thickness: 60 nm) was composed of Alq$_3$.

Further, the energy value of the conduction band was determined using a method similar to that in Example 1 or other examples. The conduction band of the electron transporting layer, composed of Alq$_3$, had an energy value of 2.61 eV.

A current of current density 20 mA/cm$^2$ was allowed to flow through the devices produced in the above manner, and the time required for the initial luminance to decrease to a half value was observed. The results are shown in Table 2.

TABLE 2

| Sample | Difference in conduction band level between hole transporting layer and electron transporting layer [eV] | Luminance half-value period [hours] |
|---|---|---|
| Example 9 | 0.84 | 350 |
| Example 10 | 0.72 | 210 |
| Example 11 | 0.63 | 170 |
| Example 12 | 0.54 | 37 |
| Comparative Example 3 | 0.47 | 0.5 |

The results in Table 2 evidently show that the charge injection type light emitting device in which the present invention has been implemented has a significantly longer luminance half-value period than charge injection type light emitting devices in which the present invention has not been implemented.

As described above, the charge injection type light emitting device of the present invention is very durable because of its long luminance half-value period.

What is claimed is:

1. A charge injection type light emitting device comprising a positive electrode, a negative electrode and an organic film sandwiched between the positive and negative electrodes and comprised of an organic compound, the organic film containing a light emitting material that emits light by itself, wherein a conduction band level Ec of the light emitting material and a conduction band level Hc of a barrier material different from the light emitting material meet the condition of Ec−Hc>0.5 eV.

2. The charge injection type light emitting device according to claim 1, wherein the conduction band levels of the light emitting material and the barrier material Ec and Hc meet the condition of Ec−Hc≧0.6 eV.

3. The charge injection type light emitting device according to claim 1, wherein said light emitting material contains a hydrocarbon compound having a condensed ring.

4. The charge injection type light emitting device according to claim 1, wherein said barrier material is arranged as a hole transporting layer comprised of an organic compound having hole transporting capability.

* * * * *